United States Patent [19]

Quinn

[11] 4,063,004

[45] Dec. 13, 1977

[54] METAL PLATING OF PLASTICS

[75] Inventor: Edward J. Quinn, East Amherst, N.Y.

[73] Assignee: Hooker Chemicals & Plastics Corporation, Niagara Falls, N.Y.

[21] Appl. No.: 645,157

[22] Filed: Dec. 30, 1975

[51] Int. Cl.$^2$ .......................... C25D 5/56; B23P 3/00
[52] U.S. Cl. .................................... 428/626; 204/30; 427/304; 427/306; 428/457; 428/462
[58] Field of Search ................... 427/304, 306; 204/30; 428/626, 457–463

[56] References Cited

U.S. PATENT DOCUMENTS

| | | | |
|---|---|---|---|
| 3,650,708 | 3/1972 | Gallagher | 29/195 |
| 3,689,303 | 9/1972 | Maguire et al. | 427/306 |
| 3,709,714 | 1/1973 | Lee | 204/30 X |
| 3,799,794 | 3/1974 | Miller | 204/30 X |
| 3,817,774 | 6/1974 | Kuzmik | 204/30 X |
| 3,853,590 | 10/1974 | Kadison et al. | 427/437 |
| 3,963,590 | 6/1976 | Deyrup | 204/30 |

Primary Examiner—F.C. Edmundson

Attorney, Agent, or Firm—P. F. Casella; Crossetta, W. J.; A. S. Cookfair

[57] ABSTRACT

Substrates, particularly plastics, are preplated with metals by pretreatment of the substrate with phosphorus sesquisulfide in an organic solvent to deposit phosphorus sesquisulfide at the surface, followed by contacting the treated surface with a metal salt or complex thereof, to form a metal-phosphorus-sulfur compound. The substrate may be treated, either before or after its surface is provided with the metal-phosphorus-sulfur compound, with a water soluble organic compound selected from the group of the so-called water soluble organic etching compounds. Preferably the organic compounds are selected from the group consisting of di and mono ethers of water soluble glycols, di and mono ethers of water soluble di-glycols, water soluble carbonates, and water soluble lactones. Treatments of the surface of the substrate with these organic compounds renders the treated surface resistant to cracking. The thus treated surface is either conductive or is capable of catalyzing the reduction of a metal salt to produce a conductive surface. Such conductive surfaces are readily electroplated by conventional techniques.

32 Claims, No Drawings

METAL PLATING OF PLASTICS

BACKGROUND OF THE INVENTION

U.S. Pat. No. 3,650,708 discloses a process for preplating substrates, particularly plastics, by subjecting the substrate to phosphorus sesquisulfide in an organic solvent to deposit phosphorus sesquisulfide at the surface of the substrate and thereafter subjecting the best treated surface to a metal salt or complex thereof to form a metal-phosphorus-sulfur compound. The thus treated surface is either conductive or is capable of catalyzing a reduction of a metal salt to produce a conductive surface. Such conductive surfaces are readily electroplated by conventional techniques.

This process has been successfully applied to many plastics such as polypropylene, ABS, polyvinyl chloride, polyethylene, polybutene, polyurethane, and other well known plastics. A more complete list of typical plastics to which the above process can be applied is included below. In addition, this process may also be used on other non-metal substrates, examples of which are also listed below.

Although this process is operable on all of the plastics described above and in more detail below, certain industrial and commercial uses of plastic articles having a metal plate, such as in the automobile industry, require a metal plate which is smooth, uniform, and substantially free of cracks, bubbles, and other irregularities. For example, ABS can be readily plated by first preplating it according to the process listed above, and subsequently electroplating it by conventional processes. However, for commercial applications, it would be desirable to improve the adhesion of the metal plate to the ABS surface for the intended commercial use.

When ABS is preplated by conventional processes which do not use phosphorus sesquifide, the surface of the ABS which is to be preplated must be etched before it can be subjected to the conventional process. Etching the surface of the ABS substrate comprises subjecting the substrate to various acidic solutions to produce varied small holes, pores and channels in the surface. Thus, etching is a destructive process in which the surface of the substrate is partially eroded by the etching solution.

Although etching is a common preliminary step in conventional preplating processes, it is not required in preplating processes using elemental phosphorus or low oxidation number phosphorus compounds such as $P_4S_3$, which are disclosed in U.S. Pat. Nos. 3,556,956; 3,650,708; and 3,666,637. In those processes the substrates are first subjected to a solvent for the purpose of swelling the surface of the substrate.

The use of organic glycol preconditioners in the conventional $CrO_3$ preplating process is well known. For example, U.S. Pat. No. 3,817,774 describes some conventional processes using the organic glycols as preconditioners in the treatment of ABS. However, because the mechanism of the phosphorus and phosphorus compound preplating processes differ from the mechanisms of the conventional preplating process, it is not totally predictable that treatment steps for conventional processes will function well when applied to the phosphorus related processes described above.

SUMMARY OF THE INVENTION

This invention provides a process for improving the adhesion of the metal plate on a plastic substrate. In the novel process, the substrate is subjected to a low oxidation number phosphorus compound, such as phosphorus sesquisulfide to deposite phosphorus sesquisulfide at the surface of the substrate; subsequently the thus-treated surface is treated with a solution of a metal salt or complex thereof to form a metal-phosphorus-sulfur compound; and finally the thus-treated surface is treated with an organic compound selected from the group consisting of water soluble di and mono ethers of glycols, di and mono ethers of diglycols, carbonates, and lactones.

In another embodiment of the novel process, the substrate is pretreated with an organic compound selected from the group consisting of water soluble mono and di ethers of mono glycols, mono and di ethers of diglycols, carbonates and lactones, then subjected to the phosphorus sesquisulfide; and finally to the metal salt solution as described above.

The thus treated substrate may be electroplated so as to deposit an adherent metal coating of the desired thickness on the electroless conductive coating.

Surprisingly, metal plated substrates prepared in accordance with the invention show improved adhesion of the metal plate to the substrate over substrates treated with phosphorus sesquisulfide and metal salt solutions but without the water soluble organic compounds listed above. Thus, this invention provides novel process and articles prepared in accordance with the steps listed above.

DESCRIPTION OF THE PREFERRED EMBODIMENTS

The process of this invention is applicable to non metallic substrates such as plastics. Other suitable substrates include, but are not limited to, cellulosic and ceramic materials such as cloth, paper, wood, cork, cardboard, clay porcelain, leather, porous glass, asbestos, cement, and other similar materials.

Typical plastics to which the metal plating process of U.S. Pat. No. 3,650,708 is applicable, for at least some applications include the homopolymers and copolymers of ethylenically unsaturated aliphatic, alicyclic and aromatic hydrocarbons such as polyethylene, polypropylene, polybutene, ethylenepropylene copolymers; copolymers of ethylene or propylene with other olefins, polybutadiene; polymers of butediene, polyisoprene, both natural and synthetic, polystyrene and polymers of pentene, hexene, heptene, octene, 2-methyl-propene, 4-methyl-hexene-1, bicyclo (2.2.1.)-2-heptene, pentadiene, hexadiene, 2,3-dimethylbutadiene-1,3,4-vinylcyclohexene, cyclopentadiene, methylatyrene, and the like. Other polymers useful in the invention include polyidene, indenecoumarone resins; polymers of acrylate esters and polymers of methacrylate esters, acrylate and methacrylate resins such as ethyl acrylate, n-butyl methacrylate, isobutyl methacrylate, ethyl methacrylate and methyl methacrylate; alkyl resins; cellulose deivatives such as cellulose acetate, cellulose acetate butyrate, cellulose nitrate, ethyl cellulose, hydroxyethyl cellulose, methyl cellulose and sodium carboxymethyl cellulose; epoxy resins; furan resins (furfuryl alcohol or furfural ketone); hydrocarbon resins from petroleum; isobutylene resins (polyisobutylene); isocyanate resins (polyurethanes); melamine resins such as melamine-formaldehyde and melamine-urea-formaldehyde; oleoresins; phenolic resins such as formaldehyde, phenolic-elastomer, phenolic-epoxy, phenolic-polyamide, and phenolic-vinyl acetals; polyamide polymers, such as polyamides, polyamide-epoxy and particularly long chain synthetic polymeric amides containing recurring carbonamide groups as an integral part of the main polymer chain; polyester resins such as unsaturated polyesters of dibasic acids and dihydroxy compounds, and polyester elastomer and resorcinol resins such as resorcinol-formaldehyde, resorcinol-furfural, resorcinol-phenol-formaldehyde, resorcinal-polyamide and resorcinol-urea; rubbers such as natural rubber, synthetic polyisoprene, reclaimed rubber, chlorinated rubber, polybutadiene, cyclized rubber, butadiene-acrylonitrile rubber, butadiene-styrene rubber, and butyl rubber; neoprene rubber (polychloroprene); polysulfides (Thiokol); terpene resins; urea resins; vinyl resins such as polymers of vinyl acetal, vinyl acetate or vinyl alcohol-acetate copolymer, vinyl alcohol, vinyl chloride, vinyl butyral, vinyl chloride-acetate copolymer, vinyl pyrrolidone and vinylidene chloride copolymer; polyformaldehyde; polyphenylene oxide; polymers of diallyl phthalates and phthalates; polycarbonates of phosgene or thiophosgene and dihydroxy compounds such as bisphenols, thermoplastic polymers of bisphenols and epichlorohydrin (trade named Phenoxy polymers); graft copolymers and polymers of unsaturated hydrocarbons and an unsaturated monomer, such as graft copolymers of polybutadiene, styrene, and acrylonitrile, commonly called ABS resins, ABS-polyvinyl chloride polymers, recently introduced under the trade name of Cycovin; and acrylic polyvinyl chloride polymers, known by the trade name of Kydex 100.

The polymers of the invention can be used in the unfilled condition, or with fillers such as glass fiber, glass powder, glass beads, asbestos, talc and other mineral fillers, wood flour and other vegetable fillers, carbon in its various forms, dyes, pigments, waxes and the like.

The substrates of the invention can be in various physical forms, such as shaped articles, for example, moldings, sheets, rods, and the like; fibers, films and fabrics, and the like.

In the first step of the preferred process of the invention, the substrate is treated with phosphorus sesquisulfide. The phosphorus sesquisulfide is dissolved in a solvent. Suitable solvents or diluents for the phosphorus sesquisulfide are solvents that dissolve the phosphorus sesquisulfide and which preferably swell the surface of a plastic without detrimentally affecting the surface of the plastic. Such solvents include the halogenated hydrocarbons and halocarbons such as chloroform, methyl chloroform, phenyl chloroform, dichloroethylene, trichloroethylene, perchloroethylene, trichloroethane, dichloropropane, ethyl dibromide, ethyl chlorobromide, propylene dibromide, monochlorobenzene, monochlorotoluene and the like; aromatic hydrocarbons such as benzene, toluene, xylene, ethyl benzene, naphthalene and the like; ketones such as acetone, methyl ethyl ketone, and the like; acetic acid; acetic acid trichloroethylene mixtures; carbon disulfide; and the like.

When a solution of phosphorus sesquisulfide is employed in the process, the solution concentration is generally in the range from about 0.0001 weight percent of phosphorus sesquisulfide based on the weight of the solution up to a saturated solution, and preferably from about 0.5 to about 2.5 percent. Prior to contacting the substrate with the phosphorus sesquisulfide, solution, the surface of the substrate should be clean. When a solution is used, the solvent generally serves to clean the surface. The phosphorus sesquisulfide treatment is generally conducted at a temperature below the softening point of the substrate, and below the boiling point of the solvent, if the solvent is used. Generally, the temperature is in the range of about 0° to 135° C, but preferably in the range of about 15° to 75° C. The contact time varies depending on the nature of the substrate, the solvent and temperature, but is generally in the range of about 1 second to 1 hour or more, preferably in the range of about 1 to 20 minutes.

It has been found that subjection of the substrate to the solvent hereinbefore disclosed prior to subjection to the phosphorus sesquisulfide has a very marked effect on the adhesion of the final metal plated article. The temperature of the solvent is directly related to the adhesion realized. Generally, the temperature is in the range of about 30° C to the boiling point of the solvent, preferably about 50° to 100° and higher than the temperature of the solution of phosphorus sesquisulfide, if a solution is used. The contact time varies depending on the nature of the substrate, solvent and temperature but preferably is 1 to 15 minutes.

As a result of the first treatment step, the phosphorus sesquisulfide is deposited in the surface of the substrate. By this is meant that the phosphorus sesquisulfide can be located on the surface, embedded in the surface and embedded beneath the surface of the substrate. The location of the phosphorus sesquisulfide is somewhat dependent on the action of the solvent on the surface.

Following the first treatment step, the substrate can be rinsed with a solvent, and then can be partially dried by merely exposing the substrate to the atmosphere, or by drying the surface with radiant heaters or in a conventional oven. Drying times can vary considerably, for example, from 1 second to 30 minutes or more, preferably 5 seconds to 10 minutes, more preferably 5 to 120 seconds. The rinsing and drying steps are optional.

In the second treatment step of the process of the invention, the phosphorus sesquisulfide treated substrate is contacted with a solution of a metal salt or a complex of a metal salt, which is capable of reacting with the phosphorus sesquisulfide to form a metal-phosphorus-sulfur compound. The term metal-phosphorus-sulfur compound used herein, means the metal-phosphorus-sulfur coating which is formed in the surface of the substrate. Without being limited to theory the metal-phosphorus-sulfur compound may be an ionic compound or a solution (alloy). The metals generally employed are those of Groups IB, IIB, IVB, VB, VIIB, and VIII of the Periodic Table. The preferred metals are copper, silver, gold, chromium, vanadium, tantalum, cadmium, tungsten, molybdenum, and the like.

The metal salts that are used in the invention can contain a wide variety of anions. Suitable anions include the anions of mineral acids such as sulfate, chloride, bromide, iodide, fluoride, nitrate, phosphate, chlorate, perchlorate, borate, carbonate, cyanide, and the like. Also useful are the anions of organic acids such as formate, acetate, citrate, butyrate, valcrate, caproate, stearate, oleate, palmitate, dimethylglyoxime, and the like. Generally, the anions of organic acids contain one to 18 carbon atoms.

Some useful metal salts include copper sulfate, copper chloride, silver nitrate, nickel chloride and nickel sulfate.

The metal salts can be complexed with a complexing agent that produces a solution having the basic pH (7). Particularly useful are the ammonical complexes of the metal salts, in which one to six ammonia molecules are complexed with the foregoing metal salts. Typical examples include $NiSO_4 6NH_3$, $NI(C_2H_2O_2)_2 6NH_2$, $CuSO_4 6NH_2$, $CuCl_2 6NH_2$, $AgNO_2 6NH_3$, $NiSO_4 3NH_2$, $CuSO_4 4NH_3$, $NiCl 6NH_2 Ni(NO_3)_2 4NH_3$, and the like. Other useful complexing agents include quinoline, amines and pyridine. Useful complexes include compounds of the formula MX O wherein M is the metal ion, X is chlorine or bromine and Q is quinoline. Typical examples include: $CoCl_2O_3$, $CoBr_2O_2$, $NiCl_2O_2$, $NiBr_2O_2$, $CuCl_2O_2$, $CuBr_2O_2$ and $ZnCl_2O_2$. Useful amine complexes include the mono-(ethylenediamine), bis-(ethylenediamine)-, tris(ethylenediamine)-, bis(1,2-propane diamine)-, and bis-(1,3-propanediamine)-complexes of salts such as copper sulfate. Typical pyridine complexes include $NiCl_2(py)_2$ and $CuCl_2(py)_2$ where py is pyridine.

The foregoing metal salts and their alcohol, are used in ionic media, preferably in aqueous solutions. However, nonaqueous media can be employed such as alcohols, for example, methyl alcohol, ethyl alcohol, butyl alcohol, heptyl alcohol, decyl alcohol and the like. Mixtures of alcohol and water can be used. Also useful are ionic mixtures of alcohol with other miscible solvents of the types disclosed hereinbefore. The solution concentration is generally in the range from about 0.1 weight percent metal salt or complex based on the total weight of the solution up to a saturated solution, preferably from about 1 to about 10 weight percent metal salt or complex. The pH of the metal salt or complex solution can range from about 4 to 14, but is generally maintained in the basic range, i.e., greater than 7, and preferably from about 10 to about 13.

The step of contacting the phosphorus sesquisulfide treated substrate with the solution of metal salt is generally conducted at a temperature below the softening point of the substrate, and below the boiling point of the solvent, if one is used. Generally, the temperature is in the range of 30° to 110° C, preferably from about 50° to 100° C. The time of contact can vary considerably, depending on the nature of the substrate, the characteristics of the metal salts employed and the contact temperature. However, the time of contact is generally in the range of about 0.1 to 30 minutes, preferably about 5 to 10 minutes.

In the third treatment step of the preferred process of the invention, the substrate having the metal-phosphorus-sulfur compound in the surface is contacted with a conditioner comprising an organic compound selected from the group consisting of water soluble di and mono ethers of glycols, di and mono ethers of diglycols, carbonates and lactones. Typical compounds which may be used are the dimethyl ether of ethylene glycol, the dimethyl ether of diethylene glycol, butyrolactone, propylene carbonate and various types of "Cellosolves."

Other suitable glycol ethers are disclosed in U.S. Pat. No. 3,698,919 and are of the formula:

RO(R'O)<sub>n</sub>H wherein R is alkyl of from 1 to 6 carbon atoms inclusive, R' is alkylene of from 2 to 3 carbon atoms inclusive, and n is an integer of from 1 to 3 inclusive.

This step may be carried out by subjecting the substrate to an aqueous solution of from about 5 percent to saturation and preferably in the range of from about 10 to 60 percent of the particular compound used. The time of the treatment may vary, depending on the nature of the substrate and the temperature, but may be from about 1 second to 1 hour or more and preferably in the range of about 1 to about 20 minutes. The temperature may range from about the freezing point of the solution to the boiling point, but is preferably in the range of about 5° to about 80° C. The substrates dried after this treatment, and optionally the substrate may be dried in an oven at elevated temperatures, preferably from about 30° to about 120° C.

In another embodiment of the invention, the substrate is treated with the organic conditioner as described above before subjecting it to the phosphorus sesquisulfide solution. The treatment is carried out as described in the paragraph immediately above. However, when the organic conditioner is used as a pretreatment step, the increase in adhesion of the metal plate to the substrate is not as great as when the substrate is treated with the conditioner after the metal-phosphorus-sulfur compound has been deposited in the surface of the substrate. Moreover, the appearance of the plated articles is much better when the organic conditioner is applied to the surface containing the metal-phosphorus-sulfur compound.

In a third embodiment, the inventive process may be carried out by admixing the organic compounds in any of the solutions used in the process described in U.S. Pat. No. 3,650,708.

The treated conductive substrate of the invention can be electroplated by the processes known in the art. The article is generally used as the cathode. The metal desired to be plated is generally dissolved in an aqueous plating bath, although other media can be employed. Generally, a soluble metal anode of the metal to be plated can be employed. In some instances, however, a carbon anode or other inert anode is used. Suitable metals, solutions and conditions for electroplating are described in "Metal Finishing Guidebook Directory" for 1967, published by Metals and Plastics Publications, Inc., Westwood, N.J.

The following examples serve to illustrate the invention but are not intended to limit it. Unless specified otherwise, all temperatures are in degrees centigrade and parts are understood to be expressed in parts by weight.

EXAMPLE 1

ABS plaques were immersed in a solution of Macuplex L-68 (α-butyrolactone and propylene carbonate) diluted at a 4 to 1 ratio with water for about 4 minutes at about 30 degrees centigrade. Following this immersion the plaques were exposed to air for about 1 minute. The plaques were then immersed in about a 1 percent solution of $P_4S_3$ in perchloroethylene at about 35° C, and were then immersed in a solution of $CuSO_4$/ethylene diamine/sodium hydroxide in water for about 15 minutes at about 60° C. The plaques were then washed and dried and electroplated with 3.5 ml of Watt's nickle. The peel strength was found to be 7.2 pounds per inch for one sample and 5.2 pounds per inch for a second sample treated in the same manner.

EXAMPLE 2

ABS plaques were treated by the same steps listed in Example 1 but in a different order. In this example the step of treating the substrate with the Macuplex/water solution was carried out after the steps of subjecting the ABS substrates to $P_4S_3$ and the metal salt solutions.

Thus, the ABS plaque having the metal-phosphorus-sulfur compound at the surface was washed, exposed to air, treated with the Macuplex/water solution for about four minutes, exposed to air for about 5 minutes, washed and dried. The plaques were then plated with about 3.5 ml of Watt's nickle. After plating, the plaques exhibited an average peel strength of about 12 lb/inch.

Various changes and modifications can be made in the process and products of this invention without departing from the spirit and scope of the invention. Various embodiments of the invention disclosed herein serve to further illustrate the invention but are not intended to limit it.

I claim:

1. A process for treating a plastic substrate which comprises subjecting the substrate to an organic compound selected from the group consisting of water soluble di and mono ethers of glycols, di and mono ethers of diglycols, carbonates and lactones; subjecting the thus treated substrate to phosphorus sesquisulfide to deposit phosphorus sesquisulfide in the surface of the coated substrate; subjecting the phosphorus sesquisulfide treated surface to a solution of a metal salt or complex thereof so as to form a metal-phosphorus-sulfur coating, wherein the metal is selected from the Groups IB, IIB, IVB, VB, VIB, VIIB and VIII of the Periodic Table.

2. The product of the process of claim 1.

3. A process wherein the treated substrate resulting from the process of claim 1 is electroplated to deposit an adherent metal coating on the treated substrate.

4. The product of the process of claim 3.

5. The process according to claim 1 wherein the substrate subjected to a solution of phosphorus sesquisulfide is dissolved in a solvent.

6. The process according to claim 5 wherein the solvent is a halogenated hydrocarbon.

7. The process according to claim 6 wherein the solvent is trichloroethylene.

8. The process according to claim 6 wherein the solvent is methylene chloride.

9. The process according to claim 6 wherein the solvent is perchloroethylene.

10. The process of claim 6 wherein the metal of said metal salt is selected from the group consisting of nickel and copper.

11. The process of claim 6 wherein the metal salt complex is a complex of ammonia, amines, quinolines or pyridines.

12. The process of claim 6 wherein the substrate is ABS.

13. The process of claim 6 wherein the organic compound is the dimethyl ether of ethylene glycol.

14. The process of claim 6 wherein the organic compound is the dimethyl ether of diethylene glycol.

15. The process of claim 6 wherein the organic compound is propylene carbonate.

16. The process of claim 6 wherein the organic compound is butyrolactone.

17. A process for treating a plastic substrate which comprises subjecting the substrate to phosphorus sesquisulfide to deposit phosphorus sesquisulfide at the surface of the coated substrate; subjecting the phosphorus sesquisulfide treated surface to a solution of a metal salt or complex thereof so as to form a metal-phosphorus-sulfur coating, wherein the metal is selected from the Groups IB, IIB, IVB, VB, VIB, VIIB, and VIII of the Periodic Table; contacting the substrate with an organic compound selected from the group consisting of water soluble di and mono ethers of glycols, di and mono ethers of diglycols, carbonates and lactones.

18. The product of the process of claim 17.

19. A process wherein the treated substrate resulting from the process of claim 17 is electroplated to deposit an adherent metal coating on the treated substrate.

20. The product of the process of claim 19.

21. The process according to claim 17 wherein the substrate subjected to a solution of phosphorus sesquisulfide is dissolved in a solvent.

22. The process according to claim 21 wherein the solvent is a halogenated hydrocarbon.

23. The process according to claim 22 wherein the solvent is trichloroethylene.

24. The process according to claim 22 wherein the solvent is methylene chloride.

25. The process according to claim 22 wherein the solvent is perchloroethylene.

26. The process of claim 22 wherein the metal of said metal salt is selected from the group consisting of nickel and copper.

27. The process of claim 22 wherein the metal salt complex is a complex of ammonia, amines, quinolines or pyridines.

28. The process of claim 22 wherein the substrate is ABS.

29. The process of claim 22 wherein the organic compound is the dimethyl ether of ethylene glycol.

30. The process of claim 22 wherein the organic compound is the dimethyl ether of diethylene glycol.

31. The process of claim 22 wherein the organic compound is propylene carbonate.

32. The process of claim 22 wherein the organic compound is butyrolactone.

* * * * *